(12) United States Patent
Kwak et al.

(10) Patent No.: US 10,437,792 B2
(45) Date of Patent: Oct. 8, 2019

(54) APPARATUS AND METHOD FOR MANAGING OF DATABASE IN ENERGY MANAGEMENT SYSTEM

(71) Applicant: LSIS CO., LTD., Gyeonggi-do (KR)

(72) Inventors: Jong-Kab Kwak, Gyeonggi-do (KR); Jong-Ho Park, Gyeonggi-do (KR); Young-Ik Lee, Gyeonggi-do (KR)

(73) Assignee: LSIS CO., LTD., Anyang-si, Gyeonggi-Do (KR)

( * ) Notice: Subject to any disclaimer, the term of this patent is extended or adjusted under 35 U.S.C. 154(b) by 215 days.

(21) Appl. No.: 15/222,552

(22) Filed: Jul. 28, 2016

(65) Prior Publication Data

US 2017/0031957 A1     Feb. 2, 2017

(30) Foreign Application Priority Data

Jul. 30, 2015   (KR) .......................... 10-2015-0108398

(51) Int. Cl.

| | |
|---|---|
| G06F 17/30 | (2006.01) |
| G06F 16/21 | (2019.01) |
| G06F 16/23 | (2019.01) |
| G06F 11/07 | (2006.01) |
| H04L 29/06 | (2006.01) |
| G01R 19/25 | (2006.01) |

(52) U.S. Cl.
CPC .......... *G06F 16/21* (2019.01); *G06F 11/0727* (2013.01); *G06F 11/0754* (2013.01); *G06F 16/2365* (2019.01); *H04L 67/42* (2013.01); *G01R 19/2513* (2013.01)

(58) Field of Classification Search
CPC .......... G06F 17/30289; G06F 11/0727; G06F 11/0754; G06F 17/30286; G06F 17/30371; G06F 16/21; G06F 16/2365; H04L 67/42; G01R 19/2513
See application file for complete search history.

(56) References Cited

U.S. PATENT DOCUMENTS

| | | | |
|---|---|---|---|
| 5,706,204 A | 1/1998 | Cox et al. | |
| 5,870,762 A * | 2/1999 | Lee | .................. G06F 17/30067 |
| 6,220,509 B1 * | 4/2001 | Byford | .................. G06Q 10/08 235/375 |

(Continued)

FOREIGN PATENT DOCUMENTS

| | | |
|---|---|---|
| CN | 101710702 A | 5/2010 |
| CN | 101876924 A | 11/2010 |

(Continued)

OTHER PUBLICATIONS

European Search Report dated Dec. 2, 2016 issued in corresponding European Application No. 16 17 7231.

(Continued)

*Primary Examiner* — Jared M Bibbee
(74) *Attorney, Agent, or Firm* — K&L Gates LLP

(57) ABSTRACT

Disclosed embodiments relate to apparatuses and methods for managing data in an energy management system. In some embodiments, an apparatus includes: a control unit configured to process data collected from a power system and create a database; and a state transfer unit configured to receive state information of the database from the control unit and offer the received state information to a client.

4 Claims, 5 Drawing Sheets

(56) References Cited

U.S. PATENT DOCUMENTS

| | | | |
|---|---|---|---|
| 6,618,822 B1* | 9/2003 | Loaiza | G06F 17/30368 |
| | | | 707/999.202 |
| 6,668,262 B1* | 12/2003 | Cook | G06F 17/30368 |
| 7,707,219 B1* | 4/2010 | Bruso | G06F 17/30362 |
| | | | 707/687 |
| 8,612,062 B2* | 12/2013 | Iino | H02J 3/14 |
| | | | 700/22 |
| 9,825,467 B2* | 11/2017 | Lee | H02J 4/00 |
| 2003/0005120 A1* | 1/2003 | Mutalik | G06F 11/1456 |
| | | | 709/225 |
| 2003/0065685 A1* | 4/2003 | Belcaid | G06F 11/1658 |
| 2009/0307034 A1* | 12/2009 | Duff | G06Q 10/04 |
| | | | 705/7.39 |
| 2009/0307573 A1* | 12/2009 | Lavelle | F24F 11/30 |
| | | | 715/205 |
| 2010/0222934 A1* | 9/2010 | Iino | G06Q 10/06 |
| | | | 700/291 |
| 2011/0040786 A1 | 2/2011 | Zhang et al. | |
| 2013/0162037 A1* | 6/2013 | Kim | H02J 7/0068 |
| | | | 307/24 |
| 2014/0156603 A1 | 6/2014 | Zhao et al. | |
| 2014/0300488 A1* | 10/2014 | Yoo | G01D 4/002 |
| | | | 340/870.02 |

FOREIGN PATENT DOCUMENTS

| | | |
|---|---|---|
| CN | 102042909 A | 5/2011 |
| CN | 104462612 A | 3/2015 |
| EP | 2 857 994 A1 | 4/2015 |
| JP | H 05-204737 A | 8/1993 |
| JP | H 10-145971 A | 5/1998 |
| JP | H 10-201138 A | 7/1998 |
| KR | 10-2000-0051051 A | 8/2000 |
| KR | 10-0964296 B1 | 6/2010 |
| KR | 10-2011 0056171 A | 5/2011 |
| KR | 10-2013-0074046 A | 7/2013 |
| KR | 10-2014-0013224 A | 2/2014 |

OTHER PUBLICATIONS

Xiao Shenyong; "Database development and management (SQL Server Version)"; Cheong Hua University; Feb. 2013; (10 pages).

China Institute of Electrical Engineering Technology; "Electrical engineering high advanced technologies series, fifth sub-book"; 2000; (11 pages).

Chinese Office Action for related Chinese Application No. 201610592610.4; dated Jul. 3, 2018; (7 pages).

* cited by examiner

PRIOR ART

APPARATUS AND METHOD FOR MANAGING OF DATABASE IN ENERGY MANAGEMENT SYSTEM

CROSS REFERENCE TO RELATED APPLICATIONS

This application claims the benefit of Korean Patent Application No. 10-2015-0108398, filed on Jul. 30, 2015 and entitled "APPARATUS AND METHOD FOR MANAGING OF DATABASE IN ENERGY MANAGEMENT SYSTEM", which is hereby incorporated by reference in its entirety.

BACKGROUND

Technical Field

The present disclosure relates to an energy management system and more particularly, to an apparatus and method for delivering database state information of an energy management system to a client.

Description of the Related Art

Under circumstances of increased government regulation for improvement of energy efficiency and reduction of greenhouse gas, increased burden on energy costs, insufficient supply of power, and so on, there is a rising interest in reducing energy consumption and improving energy efficiency. Although the reduction of energy consumption requires measures which are systematic, sustainable and effective, satisfactory means have not been suggested until now. Therefore, for the purpose of reduction of energy consumption, there is a need of powerful means for determining where and how much energy is consumed, discovering factors of energy dissipation, and finding and fulfilling improvement plans.

As such means, an energy management system (EMS) capable of monitoring and controlling a flow of energy is receiving a global spotlight. The energy management system is an integrated energy management solution capable of optimizing energy consumption by monitoring situations of energy consumption in real time and analyzing an aggregation of data based on hardware, software and ICT-based monitoring and control techniques.

A typical energy management system has a limitation in client access to a database. Problems of a conventional database managing method will be described with reference to FIG. 1.

FIG. 1 is a view showing a conventional database managing method.

A system startup, a control unit 12 of an energy management server 10 allocates a space of a database 11 to be used for a shared memory and performs one of data load, data relationship setting, hash table creation and special data relationship rearrangement. However, this cannot let a client 30 know about a task of the control unit 12 on the database 11. The control unit 12 just informs the client 30 of the fact that the database 11 has been created. Therefore, the client 30 has to make direct access to the server 10 to know about whether or not any problem occurs when the database 11 is created.

In addition, even if any problem occurs in the database 11 during the operation of the energy management system, the client 30 cannot know what this problem is. For example, the problem of the database 11 may include a memory access failure and a faulty of data collected from a power system.

Further, the client 30 cannot know about any deletion of the database 11 which may be caused when the energy management system is stopped.

SUMMARY

It is an aspect of some embodiments of the present disclosure to provide a database management apparatus and method which is capable of monitoring and managing the state of a database of an energy management system with high efficiency.

It is another aspect of some embodiments of the present disclosure to provide a database management apparatus and method which is capable of delivering an error message to a user if an error occurs in a database of an energy management system or the database is in an abnormal state, In accordance with one aspect of some embodiments of the present disclosure, there is provided an apparatus for managing data in an energy management system, including: a control unit configured to process data collected from a power system and create a database; and a state transfer unit configured to receive state information of the database from the control unit and provide or offer the received state information to a client.

In some embodiments, the state information of the database may be at least one of database creation step information, database deletion step and database presence/absence information.

In some embodiments, the state transfer unit may determine whether or not an error is contained in the database, and offer a result of the determination to the client.

In some embodiments, the state transfer unit may determine whether or not an error is contained in the database, based on whether or not the data included in the database fall within a normal range.

In some embodiments, the state transfer unit may offer the database state information to the client for each predetermined period or at a predetermined frequency.

In some embodiments, the state transfer unit may offer the database state information to the client each time the state of the database is changed.

In some embodiments, the state transfer unit may offer the database state information to the client at a request from the client.

According to some embodiments of the present disclosure, it is possible to provide a database management apparatus and method which is capable of monitoring and managing the state of a database of an energy management system with high efficiency.

According to some embodiments of the present disclosure, it is possible to provide a database management apparatus and method which is capable of delivering an error message to a user if an error occurs in a database of an energy management system or the database is in an abnormal state.

DETAILED DESCRIPTION

Figure 1:
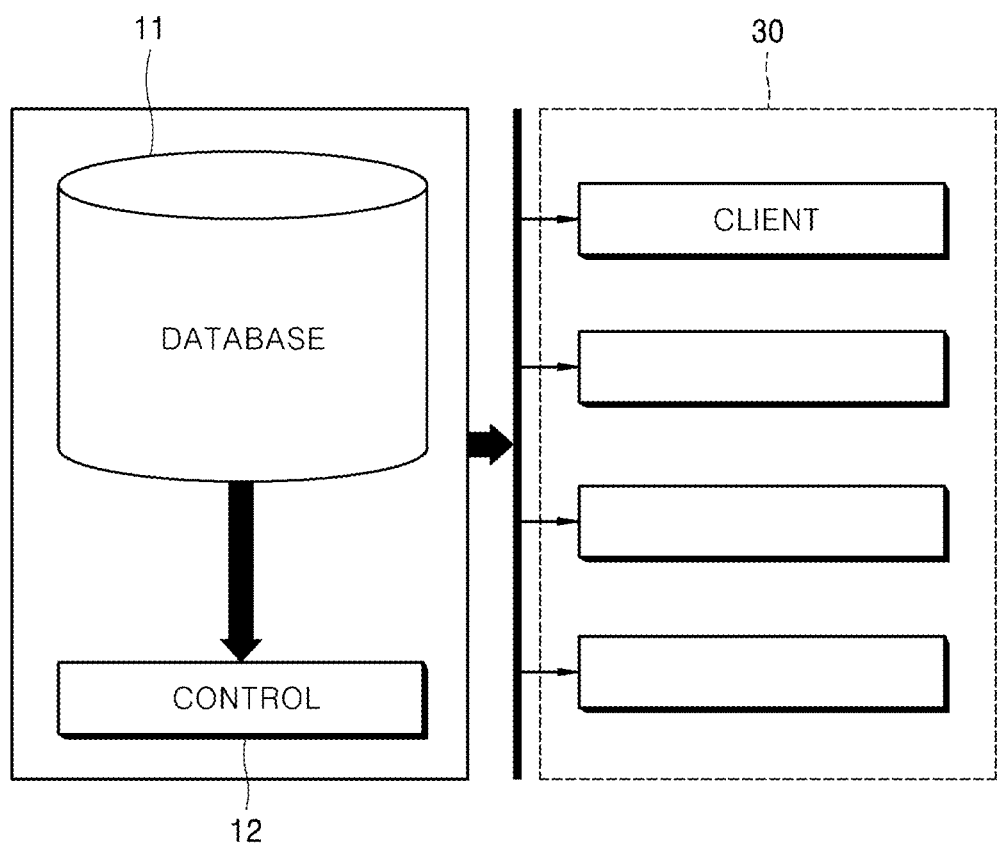
FIG. 1 is a view showing a conventional database managing method, according to the prior art.

Hereinafter, embodiments of the present disclosure will be described in detail with reference to the accompanying drawings. It should be understood that the present disclosure is not limited to the following embodiments, and that some embodiments are provided for illustrative purposes only. The scope of the disclosure should be defined only by the accompanying claims and equivalents thereof.

In the following description, the terms "module" and "part," which are suffixes for elements, are given or used alone or in combination for the purpose of facilitating the description, but these terms are not intended to make a distinction between both.

Combinations of blocks in the accompanying drawings and steps in a flow chart may be performed according to computer program instructions. These computer program instructions can be installed in general-purpose computers, special-purpose computers or other processors of programmable data processing equipment. Therefore, the instructions executed by the computers or other processors of programmable data processing equipment create means for performing functions described in blocks in the drawings or in steps in the flow chart. These computer program instructions can be stored in computer-usable or computer-readable memories which can assist in the computers or other processors of programmable data processing equipment to implement particular functions in particular manners. Therefore, the instructions stored in the computer-usable or computer-readable memories can be used to make products containing instruction means for performing the functions described in the blocks in the drawings or in the steps in the flow chart. The computer program instructions can also be installed in the computers or other processors of programmable data processing equipment. Therefore, a sequence of operation steps can be performed on the computers or other processors of programmable data processing equipment to produce computer-executable processes. In addition, the instructions operating the computers or other processors of programmable data processing equipment can provide steps for executing the functions described in the blocks in the drawings or in the steps in the flow chart.

In addition, the blocks or the steps may represent portions of modules, segments or codes including one or more executable instructions for executing a specified logical function(s). In addition, in some alternative embodiments, it should be noted that the functions described in the blocks or steps may be performed out of a specified sequence. For example, two successive blocks or steps may be performed substantially at once or may be sometimes performed in a reverse order depending on a corresponding function.

An energy management system is an integrated power management system for producing electric power economically and supplying it stably. The energy management system includes a power generation planning function of automatically predicting power generation and demand, controlling the power generation capacity, and calculating economic dispatch and optimal power flow. In addition, the energy management system includes a power system analysis function of interpreting and analyzing static and dynamic characteristics of a power system or power equipment and finding the optimal configuration and operation plan of the power system. Such functions require static data, dynamic data and a fast-accessible database in which data can be stored. In addition, since the energy management system may calculate and check values of the data in real time, the system create and stores the database in a memory in the form of data rather than a disc in the form of a file.

In the energy management system, in order to store data in a memory including even less capacity than a file, a space design for storage of data in a memory space is required. In addition, tasks of functions of data correlation, hash generation, special data interpretation and query interpretation in system startup are required. In addition, in the operation of the energy management system, the state of the database and the operation of specified functions may be periodically known. In some embodiments of the present disclosure, a database management apparatus of the energy management system offers a process of creation, operation and deletion of the database to a user. In addition, the database management apparatus of the energy management system according to some embodiments of the present disclosure can cope with any unpredicted problems with high efficiency.

Hereinafter, some embodiments of the present disclosure will be described in detail with reference to the drawings.

Figure 2:
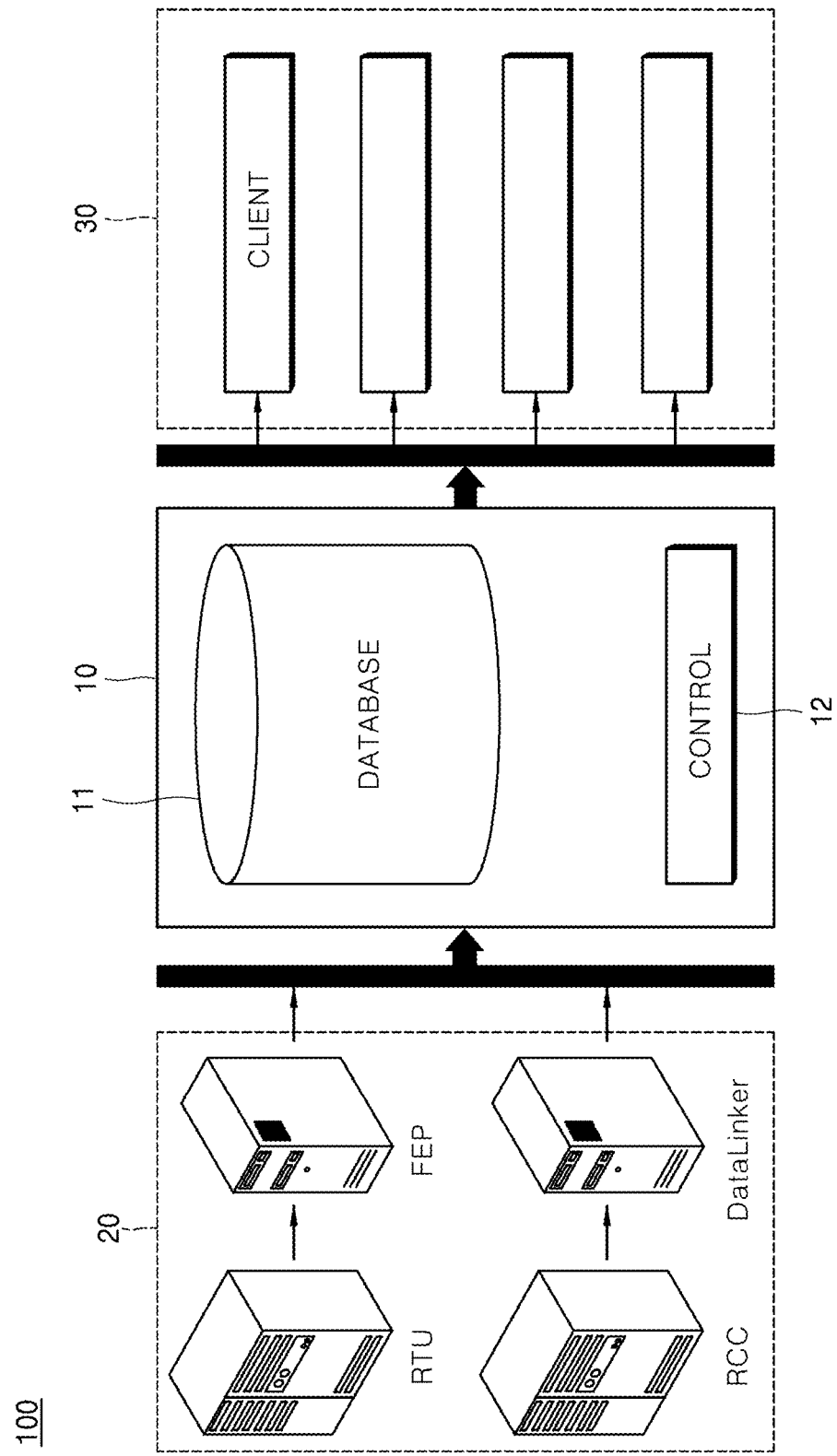
FIG. 2 is a block diagram illustrating the configuration of an energy management system according to some embodiments of the present disclosure.

FIG. 2 is a block diagram illustrating the configuration of an energy management system according to some embodiments of the present disclosure.

Referring to FIG. 2, an energy management system 100 according to some embodiments of the present disclosure may include an energy management server 10, a client 30 and a power system 20.

The energy management server 10 can receive data from the power system 20 and create the data in the form of a database. In addition, the energy management server 10 can provide the database to the client 30. In addition, the energy management server 10 can manage and control the power system 20. The energy management server 10 may be connected to a plurality of clients 30. In addition, the energy management server 10 may include a dual structure.

The energy management server 10 may include a database 11 and a control unit 12.

The database 11 can collect/store measurement data received from the power system 20 and store operational data based on the measurement data for each predetermined period. In addition, the database 11 can automatically create and store a list of measurement and operational data and store a list of policy data.

The control unit 12 can control the overall operation of the energy management server 10. In some embodiments, the control unit 12 can create the database 11 by processing data delivered from the power system 20. In other embodiments, the control unit 12 can provide specified data to the client 30 at a request from the client 30.

Hereinafter, some embodiments of the present disclosure capable of solving the above-described problems will be described with reference to FIGS. 3 and 4.

Figure 3:
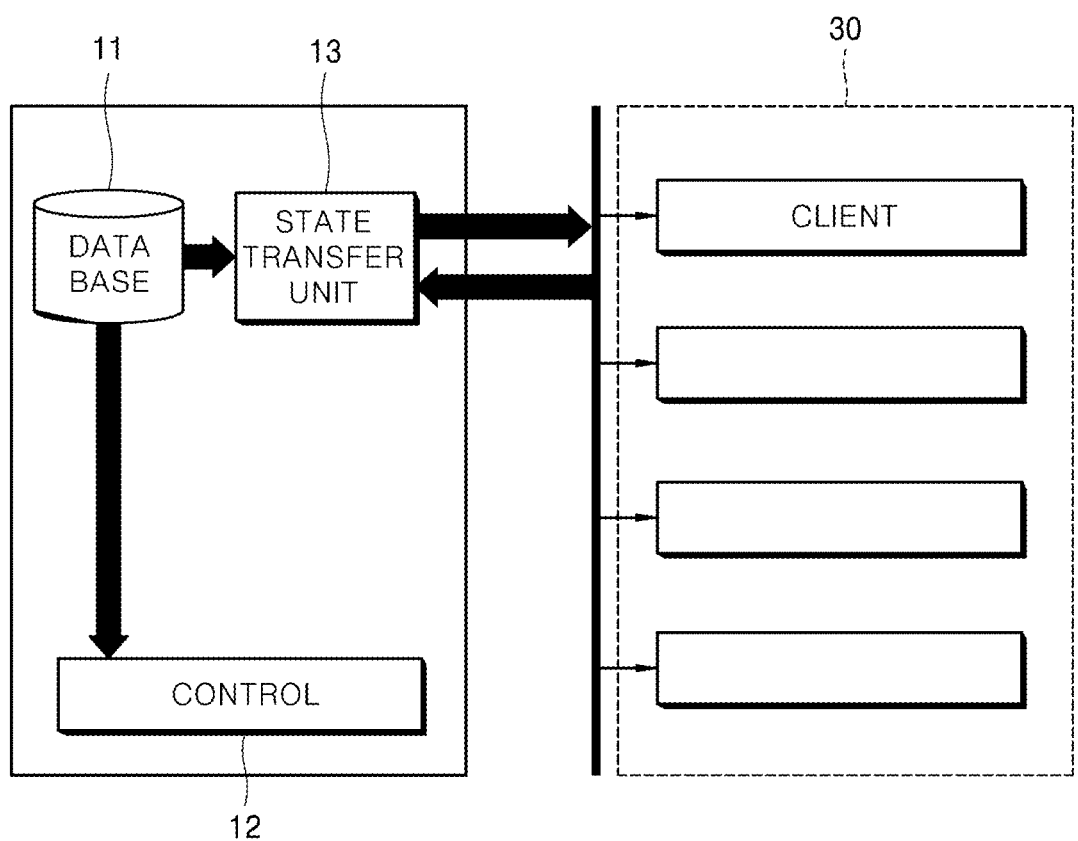
FIG. 3 is a view illustrating an energy management server according to some embodiments of the present disclosure.

FIG. 3 is a view illustrating an energy management server according to some embodiments of the present disclosure. As illustrated in FIG. 3, an energy management server 10 further includes a state transfer unit 13, in addition to some embodiments of FIG. 2.

The state transfer unit 13 is directly connected to the client 30. The state transfer unit 13 can directly receive a request from the client 30 and offer a response to the received request to the client 30.

In some embodiments, the state transfer unit 13 may offer creation step information of the database 11 to the client 30. In this case, the creation step of the database 11 may be one of database generation start, static data load, upper/lower level data relationship rearrangement, indirect data relationship rearrangement, generation of hash table for data name, special data relationship rearrangement, whole data summing-up and database generation completion.

In some embodiments, the state transfer unit 13 may offer deletion step information of the database 11 to the client 30.

In other embodiment, the state transfer unit 13 may offer presence/absence information of the database 11 to the client 30.

In other embodiment, the state transfer unit 13 may determine whether or not a data error is contained in the database 11. Specifically, the state transfer unit 13 can determine whether or not a data error is contained in the database 11 by determining whether or not a data value contained in the database 11 falls within a normal range. For example, assuming that a normal power value lies between 60 and 80, if a power value contained in the database 11 is 40, the state transfer unit 13 can determine that a data error is contained in the database 11. Then, the state transfer unit 13 can offer the error information occurred in the database 11 to the client 30. Accordingly, the client 30 can receive the error information and take a proper measure based on the error information.

In addition, the state transfer unit 13 can also offer the error information occurred in the database 11 to the control unit 12. The control unit 12 can recreate or delete the database 11 based on the error information.

Figure 4:
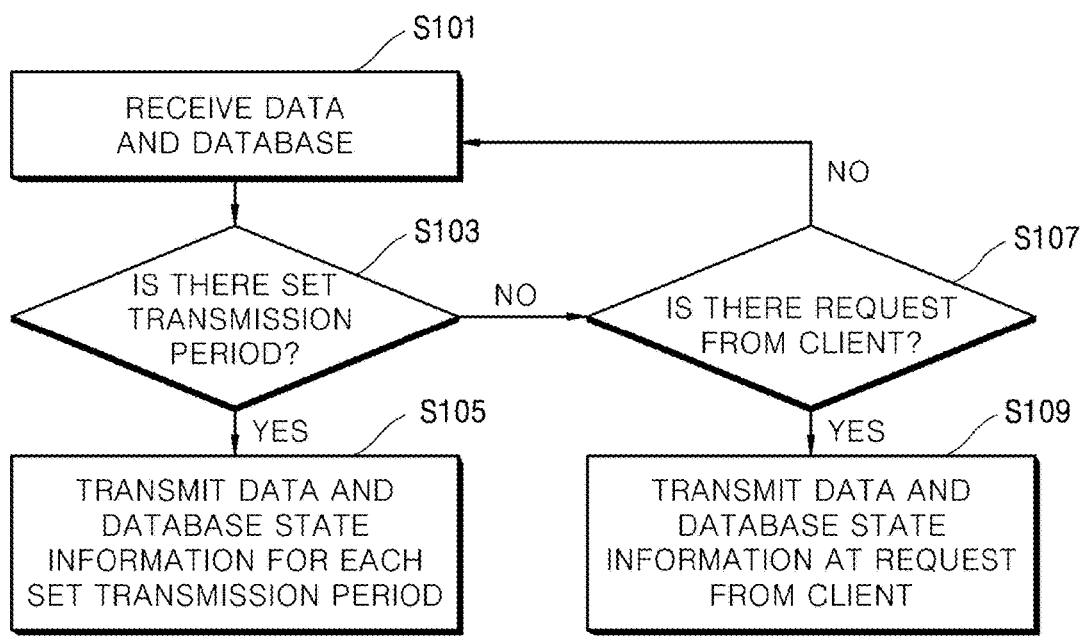
FIG. 4 is a flow chart illustrating an operation process of a state transfer unit, according to some embodiments of the present disclosure.

FIG. 4 is a flow chart illustrating an operation process of the state transfer unit 13.

The state transfer unit 13 receives one of data and database state information (S101). In some embodiments, the state transfer unit 13 may receive data from the database 11. In addition, the state transfer unit 13 may receive data being current executed from the control unit 12.

In some embodiments, the state transfer unit 13 may receive state information of the database 11. Specifically, the state transfer unit 13 may receive state information of the database 11 from the control unit 12. As described above, the state information of the database 11 may be at least one of the creation step information, the deletion step information and the presence/absence information.

The state transfer unit 13 determines whether or not there is a set transmission period (S103). If the state information of the database 11 is consistently transmitted even when there is no change in state of the database 11, an overload may occur in the system. In addition, communication traffic may be unnecessarily wasted.

In some embodiments, the set transmission period may be a constant period. For example, the transmission period may be set to 2 seconds.

In some embodiments, the set transmission period may be a period at which the state information of the database 11 is transmitted each time the state of the database 11 is changed. Specifically, since the state information need not be transmitted if there is no changed in state of the database 11, a transmission period at which the state transfer unit 13 transmits the state information only when the change of state of the database 11 is detected may be set.

If there exists a set transmission period, the state transfer unit 13 transmits the state information of the database 11 to the client 30 based on the transmission period (S105).

If there exists no set transmission period, the state transfer unit 13 determines whether or not there is a request for state information transmission from the client 30 (S107). If there is no request for state information transmission from the client 30, the state transfer unit 13 returns to the step S101 to receive the state information of the database 11.

Otherwise, if there is a request for state information transmission from the client 30, the state transfer unit 13 transmits the database state information corresponding to the request from the client 30 (S109). In some embodiments, when the client 30 requests the database creation step information, the state transfer unit 13 may transmit the current creation step information of the database 11. In some embodiments, if there is a request for state information transmission from a plurality of clients 30, the state transfer unit 13 may transmit the state information to the plurality of clients 30 at once.

Figure 5:
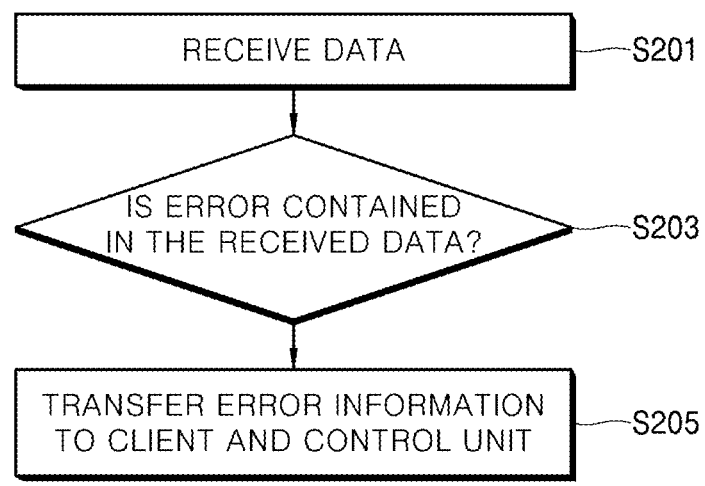
FIG. 5 is a flow chart illustrating a process of the state transfer unit to handle an error contained in a database, according to some embodiments of the present disclosure.

FIG. 5 is a flow chart illustrating a process of the state transfer unit to handle an error contained in the database 11.

The state transfer unit 13 receives data from the database 11 (S201). The data received from the database 11 may be one of digital data and analog data.

The state transfer unit 13 determines whether or not an error is contained in the received data (S203). In this case, the data error may be an error which occurs in the course of processing correct data received by the control unit 12 or an error which occurs when the control unit 12 receives incorrect data from the power system.

In some embodiments, if there exists the above-mentioned transmission period, the state transfer unit 13 determines whether or not an error is contained in the received data, based on the transmission period. This allows the state transfer unit 13 to determine whether or not there is an error in accordance with the transmission period without determining whether or not the error is contained in all of the received data, thereby reducing a system overload.

If an error is contained in the received data, the state transfer unit 13 transfers the error information to the client 30 and the control unit 12 (S205). Accordingly, the client 30 can receive the error information of the database 11 with no need to access the server 10 or the database 11 separately. In addition, the control unit 12 may not determine whether or not an error is contained in the database 11, thereby reducing the system overload.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of some embodiments described herein may be made without departing from the spirit of the disclosures. The accompanying claims and their equivalents are intended to cover such forms or modifications as would fall within the scope and spirit of the disclosures. Various components illustrated in the figures may be implemented as hardware and/or software and/or firmware on a processor, ASIC/FPGA, dedicated hardware, and/or logic circuitry. Also, the features and attributes of the specific embodiments disclosed above may be combined in different ways to form additional embodiments, all of which fall within the scope of the present disclosure. Although the present disclosure provides certain preferred embodiments and applications, other embodiments that are apparent to those of ordinary skill in the art, including embodiments which do not provide all of the features and advantages set forth herein, are also within the scope of this disclosure. Accordingly, the scope of the present disclosure is intended to be defined only by reference to the appended claims.

What is claimed is:

1. An apparatus for managing data in an energy management system, comprising:
    a control unit configured to process data collected from a power system and create a database; and
    a state transfer unit configured to (i) receive data from the database and state information of the database comprising at least one of database creation step information, database deletion step information, database presence information, and database absence information from the control unit and (ii) provide the received state information to a client,
    wherein the state transfer unit is further configured to (i) determine whether or not an error is included in the database based on whether or not the data from the database is within a normal range, and (ii) provide an error determination to the client and to the control unit,
    wherein the state transfer unit is further configured to determine whether a set transmission period exists,
    wherein the state transfer unit is further configured to provide the state information to the client each time the state of the database has been changed when the set transmission period is a period at which the state information is transmitted each time the state of the database is changed, and
    wherein the control unit is further configured to recreate or delete the database based on the error determination received from the state transfer unit.

2. The apparatus according to claim 1, wherein the state transfer unit is further configured to provide the database state information to the client at a predetermined frequency when the set transmission period is a constant period.

3. The apparatus according to claim 1, wherein the state transfer unit is further configured to provide the state information to the client in response to a request from the client when the set transmission period is nonexistent.

4. The apparatus according to claim 1, wherein the database creation step information comprises information regarding at least one of: database generation start, static data load, upper level data relationship rearrangement, lower level data relationship rearrangement, indirect data relationship rearrangement, generation of hash table for data name, special data relationship rearrangement, whole data summing-up, and database generation completion.

* * * * *